US008652767B2

(12) United States Patent
Watanabe et al.

(10) Patent No.: US 8,652,767 B2
(45) Date of Patent: Feb. 18, 2014

(54) LIQUID EJECTION HEAD AND PROCESS FOR PRODUCING THE SAME

(75) Inventors: Makoto Watanabe, Yokohama (JP); Yoshinori Tagawa, Yokohama (JP); Hiroyuki Murayama, Kawasaki (JP); Mitsuru Chida, Yokohama (JP); Masataka Nagai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/359,249

(22) Filed: Jan. 26, 2012

(65) Prior Publication Data

US 2012/0218350 A1 Aug. 30, 2012

(30) Foreign Application Priority Data

Feb. 28, 2011 (JP) ................................ 2011-042028

(51) Int. Cl.
*G03F 1/00* (2012.01)

(52) U.S. Cl.
USPC .......................................... 430/320; 430/322

(58) Field of Classification Search
USPC .................................................. 430/320, 322
See application file for complete search history.

(56) References Cited

U.S. PATENT DOCUMENTS

| | | | | |
|---|---|---|---|---|
| 5,508,725 | A | 4/1996 | Goto et al. | |
| 7,169,537 | B2 * | 1/2007 | Miura et al. | 430/320 |
| 8,148,049 | B2 | 4/2012 | Murayama et al. | |
| 2003/0218655 | A1 | 11/2003 | Yokouchi et al. | |
| 2005/0130075 | A1 | 6/2005 | Shaarawi et al. | |
| 2006/0172227 | A1 * | 8/2006 | Shaarawi et al. | 430/311 |
| 2008/0309733 | A1 * | 12/2008 | Horiuchi et al. | 347/65 |
| 2009/0136875 | A1 * | 5/2009 | Kubota et al. | 430/320 |
| 2009/0191487 | A1 * | 7/2009 | Murayama et al. | 430/320 |
| 2009/0229125 | A1 | 9/2009 | Kato et al. | |

FOREIGN PATENT DOCUMENTS

| | | | |
|---|---|---|---|
| EP | 0 419 190 | A2 | 3/1991 |
| JP | 9-207341 | A | 8/1997 |
| JP | 9-216368 | A | 8/1997 |
| JP | 9-234871 | A | 9/1997 |
| JP | 2008-119955 | A | 5/2008 |

OTHER PUBLICATIONS

Extended European Search Report in European Application No. 12000676.2 (Jun. 18, 2012).
Office Action in Russian Application No. 2012107068 (dated May 29, 2013).

* cited by examiner

*Primary Examiner* — Stewart Fraser
(74) *Attorney, Agent, or Firm* — Fitzpatrick, Cella, Harper & Scinto

(57) ABSTRACT

Provided is a process for producing a liquid ejection head including an ejection orifice member having a plurality of ejection orifices for ejecting liquid provided along an arrangement direction, the process including preparing a substrate provided with a resin layer which contains a photocurable resin; carrying out a first exposure treatment and a second exposure treatment which are each of an exposure treatment of subjecting the resin layer to exposure; and forming the ejection orifices of the resin layer subjected to the first exposure treatment and the second exposure treatment. An inclination angle of a side wall of the ejection orifices formed by the first exposure treatment with respect to the substrate differs from an inclination angle of a side wall of the ejection orifices formed by the second exposure treatment with respect to the substrate.

4 Claims, 10 Drawing Sheets

LIQUID EJECTION HEAD AND PROCESS FOR PRODUCING THE SAME

BACKGROUND OF THE INVENTION

1. Field of the Invention

The present invention relates to a liquid ejection head for ejecting liquid and a process for producing the same.

2. Description of the Related Art

An ink jet recording head applied to an ink jet recording method which conducts recording by ejecting ink onto a recording medium is a typical example of a liquid ejection head which ejects liquid. Such an ink jet recording head generally includes an ink flow path, an ejection energy generating portion provided in a part of the flow path, and an ink ejection orifice for ejecting ink using energy generated in the ejection energy generating portion.

As an example of a liquid ejection head applicable to an ink jet recording head, Japanese Patent Application Laid-Open No. H09-234871 discloses a liquid ejection head which includes an ejection orifice member having an ejection orifice with such a shape that a flow inlet of liquid is large with respect to an outlet of liquid to be ejected.

US 2005/0130075 discloses, as a process for producing an ejection orifice member having an ejection orifice with such a shape that a flow inlet of liquid is large with respect to an outlet of liquid to be ejected, a method in which a photocurable resin is subjected to exposure, with an image forming position being adjusted, on a substrate having plurality of ejection energy generating portions.

Even when the outlet of liquid is made finer, by causing the ejection orifice to be shaped so that the flow inlet of liquid is large with respect to the outlet of liquid, the flow resistance may be reduced, and problems with regard to ejection characteristics can be dealt with, for example, refill characteristics degradation may be suppressed.

In order to conduct recording of a high quality image at high speed while suppressing enlargement of a recording apparatus, in a liquid ejection head, it has been required to densely arrange ejection orifices each having fine outlet of liquid and flow paths communicating therewith, respectively.

However, when an ejection orifice member in which ejection orifices each shaped so that the flow inlet of liquid is large with respect to the outlet of liquid are densely arranged is formed in the method disclosed in US 2005/0130075, a wall which separates adjacent ejection orifices is thin on the side of the flow inlet of liquid of the ejection orifices, and thus, the strength of the ejection orifice member may be decreased.

SUMMARY OF THE INVENTION

The present invention has been made in view of the above-mentioned problem, and it is an object of the present invention to provide a process for producing a liquid ejection head capable of producing with high yield a liquid ejection head including an ejection orifice member that has an ejection orifice with a reduced flow resistance and that has satisfactory strength.

Thus, the present invention provides a process for producing a liquid ejection head including an ejection orifice member having therein plurality of ejection orifices for ejecting liquid provided along an arrangement direction, the process including: preparing a substrate provided with a resin layer which contains a photocurable resin; carrying out a first exposure treatment and a second exposure treatment which are each of an exposure treatment of subjecting the resin layer to exposure; and forming the ejection orifices of the resin layer subjected to the first exposure treatment and the second exposure treatment, in which an inclination angle of a side wall of the ejection orifices formed by the first exposure treatment with respect to the substrate differs from an inclination angle of a side wall of the ejection orifices formed by the second exposure treatment with respect to the substrate.

Further features of the present invention will become apparent from the following description of exemplary embodiments with reference to the attached drawings.

DESCRIPTION OF THE EMBODIMENTS

Embodiments of the present invention are described with reference to the attached drawings.

First Embodiment

Figure 2:
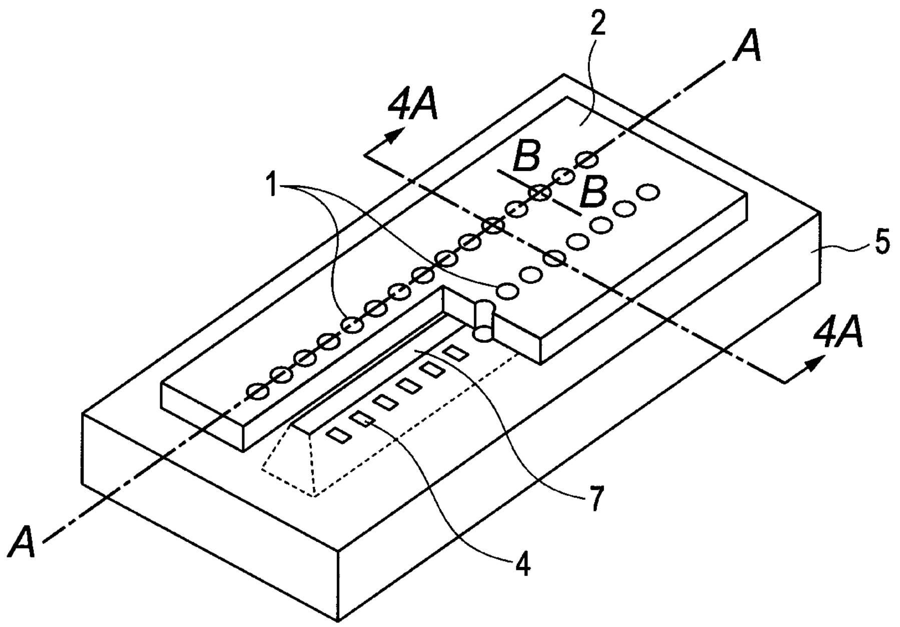
FIG. 2 is a schematic perspective view of the exemplary structure of the liquid ejection head obtained by the production process according to the first embodiment.

FIG. 2 is a schematic perspective view illustrating an exemplary structure of an ink jet recording head produced according to a first embodiment of the present invention. The ink jet recording head (liquid ejection head) includes a silicon substrate 5 in which two lines of ejection energy generating elements 4 are formed in an arrangement direction at a predetermined pitch. An ink supply port (liquid supply port) 7 opens in the silicon substrate 5 between the two lines of the ejection energy generating elements 4. Ink ejection orifices (liquid ejection orifices) 1 for ejecting ink and ink flow paths (liquid flow paths) 5 which communicate with the ink supply port 7 and with the ink ejection orifices 1, respectively, are formed by a flow path forming member 2 on the silicon substrate 5. The ink ejection orifices 1 open over the ejection energy generating elements 4, respectively, and are provided in two lines in the arrangement direction.

The ink jet recording head is arranged so that a surface thereof in which the ink ejection orifices 1 are formed faces a recording surface of a recording medium. By applying pressure generated by the ejection energy generating elements 4 to ink (liquid) which is fed into the ink flow paths 5 from the common ink supply port 7, ink droplets are caused to be ejected from the ink ejection orifices 1, which adhere to a recording medium to conduct recording thereon.

Figure 1A:
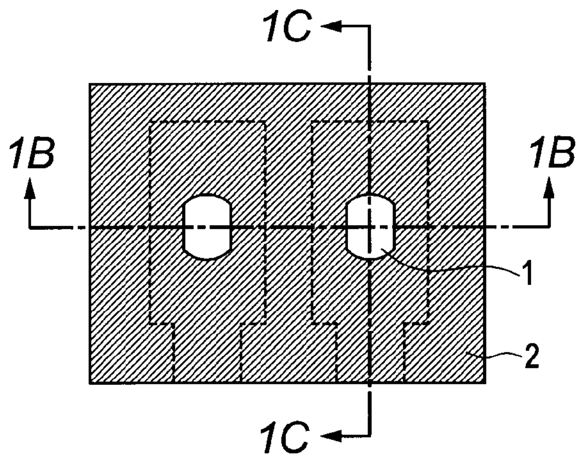
FIGS. 1A, 1B and 1C illustrate an exemplary structure of a liquid ejection head obtained by a production process according to a first embodiment of the present invention.
Figure 1C:
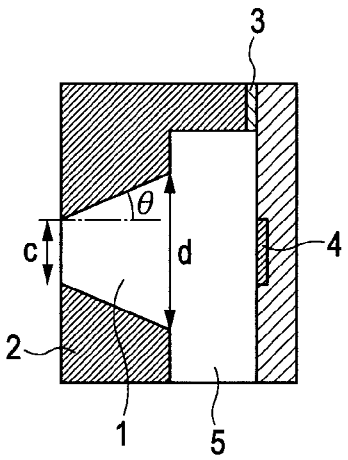
Figure 1B:
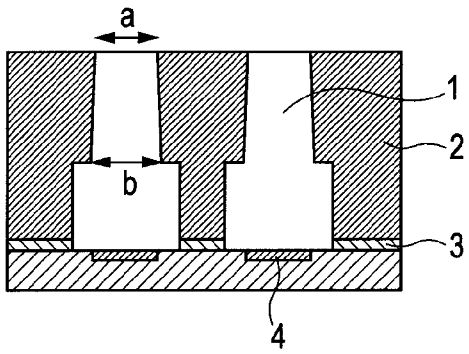

An exemplary structure of an ink jet recording head produced by a production process according to this embodiment is more specifically described in the following. FIG. 1A is a plan view of the ejection orifices illustrated in FIG. 2, FIG. 1B is a sectional view taken along the line 1B-1B of FIG. 1A, and FIG. 1C is a sectional view taken along the line 1C-1C of FIG. 1A. The line 1B-1B indicates the arrangement direction while the line 1C-1C indicates an orthogonal direction which is orthogonal to the arrangement direction. Therefore, FIG. 1B illustrates a shape in cross section of the ejection orifices taken along a surface perpendicular to the orthogonal direction while FIG. 1C illustrates a shape in cross section of the ejection orifice taken along a surface perpendicular to the arrangement direction.

As illustrated in FIGS. 1A and 1B, each of the ejection orifices formed according to this embodiment has a side wall along the orthogonal direction. Further, as illustrated in FIG. 1B, the shape in cross section of each of the ejection orifices taken along the surface perpendicular to the orthogonal direction is a tapered shape or a quadrangular shape. Further, as illustrated in FIG. 1C, the shape in cross section of each of the ejection orifices taken along the surface perpendicular to the arrangement direction is a tapered shape. By forming the ejection orifices so as to have a tapered shape, a liquid ejection head having a low flow resistance and excellent ejection performance may be obtained.

Here, the production process according to this embodiment includes the following steps.

(1) A step of preparing a substrate provided with a resin layer containing a photocurable resin.

(2) An exposing step of carrying out first exposure treatment and second exposure treatment which are exposure treatment for subjecting the resin layer to exposure.

(3) A step of forming the ejection orifices of the resin layer after the first exposure treatment and the second exposure treatment.

The present invention has such a feature that the inclination angle of a side wall of the ejection orifices formed by the first exposure treatment with respect to the substrate differs from the inclination angle of a side wall of the ejection orifices formed by the second exposure treatment with respect to the substrate. It is preferred that the first exposure treatment be of a treatment of subjecting a portion of the resin layer corresponding to the side wall along the orthogonal direction to exposure so that a ratio b/a is equal to or larger than one, where 'a' is a width in the arrangement direction of a front side opening of the ejection orifice and 'b' is a width in the arrangement direction of a back side opening of the ejection orifice.

Further, it is preferred that the second exposure treatment be of a treatment of subjecting a portion of the resin layer corresponding to other side walls than the side wall along the orthogonal direction to exposure so that a ratio d/c is larger than one, where 'c' is a width in the orthogonal direction of the front side opening of the ejection orifice and 'd' is a width in the orthogonal direction of the back side opening of the ejection orifice.

Further, it is preferred that the first exposure treatment and the second exposure treatment be carried out so that the ratio d/c is larger than the ratio b/a.

It is preferred that the shape in cross section of the ejection orifices taken along a surface perpendicular to the orthogonal direction be a tapered shape or a quadrangular shape. Further, the shape in cross section of the ejection orifices taken along a surface perpendicular to the arrangement direction be a tapered shape. Note that, even when both of those cross section shapes are tapered shapes, the inclination angles thereof with respect to the substrate are different from each other.

Further, it is preferred that the width a and the width b be the width of an upper side and the width of a lower side, respectively, of a shape in cross section of the ejection orifice taken along a surface which is perpendicular to the arrangement direction and which passes through the center of the ejection orifice. Further, it is preferred that the width c and the width d be the width of an upper side and the width of a lower side, respectively, of a shape in cross section of the ejection orifice taken along a surface which is perpendicular to the orthogonal direction and which passes through the center of the ejection orifice. According to the present invention, it is possible to produce a liquid ejection head including a substrate and an ejection orifice member provided on the substrate in which a plurality of ejection orifices for ejecting liquid are provided along an arrangement direction, in which a side wall along an orthogonal direction orthogonal to the arrangement direction of the plurality of ejection orifices is perpendicular to the substrate and a side wall along the arrangement direction of the plurality of ejection orifices forms an acute angle with respect to the substrate.

The production process according to this embodiment is described in the following. Note that, the present invention is not limited to the following embodiment.

Note that, in the following description, an ink jet recording head is described as an example to which the present invention may be applied, but the scope of application of the present invention is not limited thereto. Further, the present invention may be applied not only a process for producing an ink jet recording head but also to a process for producing a liquid ejection head, which is used for manufacturing a biochip or for printing an electronic circuit. Such a liquid ejection head includes an ink jet recording head, a head for manufacturing a color filter, and the like.

Further, a nozzle density as used in this embodiment refers to the number of nozzles per unit length in a direction of the line 1B-1B of FIG. 1A. In this embodiment, the nozzle density may be, for example, 1,200 DPI (dots/inch).

FIGS. 3A to 3F illustrate exemplary steps in the production process according to this embodiment. FIGS. 3A to 3F illustrate the steps in cross section taken along a surface which is perpendicular to the arrangement direction.

Figure 3A:
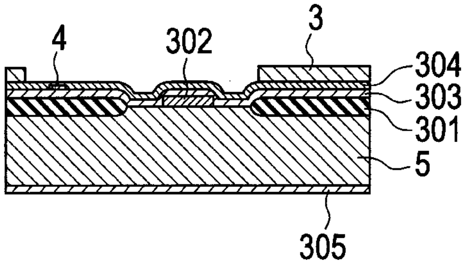
FIGS. 3A, 3B, 3C, 3D, 3E and 3F are sectional process views illustrating the production process according to the first embodiment.

First, as illustrated in FIG. 3A, a silicon substrate 5 having an ejection energy generating element 4 arranged therein is prepared.

The silicon substrate 5 has a crystal orientation of, for example, (100) surface. Note that, in this embodiment, a case where the (100) surface is used is described, but the plane orientation which may be used in the present invention is not limited thereto.

A thermally oxidized film 301 and a sacrifice layer 302 are formed on the silicon substrate 5. A silicon oxide film 303 which is an insulating layer is formed on the thermally oxidized film 301. A plurality of ejection energy generating elements 4 such as heat generating resistors are arranged on the silicon oxide film 303. A silicon nitride film 304 as a protective film is formed on the silicon oxide film 303 and the ejection energy generating elements 4.

By forming the sacrifice layer 302, a surface opening of an ink supply port (liquid supply port) can be formed with good precision. The sacrifice layer contains aluminum and may be etched by an etchant for a silicon substrate (alkaline solution). As the material of the sacrifice layer, for example, aluminum (Al), aluminum silicon (AlSi), aluminum copper (AlCu), or aluminum silicon copper (AlSiCu) may be used. Among them, aluminum or aluminum copper is preferred. AlSi is a compound containing Al and Si, AlCu is a compound containing Al and Cu, and AlSiCu is a compound containing Al, Si, and Cu.

Further, an adhesion-improving layer 3 is formed on the silicon nitride film 304. As the adhesion-improving layer 3, for example, a polyetheramide resin may be used. Further, the adhesion-improving layer 3 may be applied and arranged by spin coating or the like. As the polyetheramide resin, for example, specifically, a material produced by Hitachi Chemical Co., Ltd. under the trade name of HIMAL-1200 may be used. The thickness of the adhesion-improving layer 3 is, for example, 2 μm.

Figure 3B:
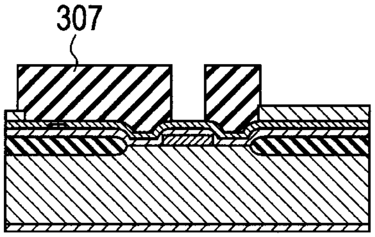

Then, as illustrated in FIG. 3B, a dissolvable resin is used to form a flow path form material 307 to be a form of an ink flow path is formed on the silicon substrate 5 including the ejection energy generating element 4.

The flow path form material 307 may be formed by, for example, applying a positive resist by spin coating or the like and then carrying out exposure and development with ultraviolet radiation, deep UV radiation, or the like. As such a positive resist, for example, ODUR (trade name, produced by TOKYO OHKA KOGYO CO., LTD.) may be used.

Figure 3C:
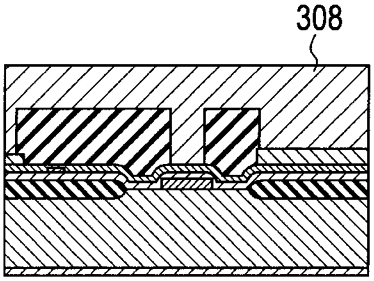

Then, as illustrated in FIG. 3C, a negative photosensitive resin 308 is arranged on the adhesion-improving layer 3 and the flow path form material 307 by spin coating or the like.

In this embodiment, as the flow path forming member, a negative photosensitive resin is used. A negative photosensitive resin is cured by exposure. As such a negative photosensitive resin, one which is sensitive to the i-line is preferred. Further, the thickness of the negative photosensitive resin is, for example, 30 μm.

In the exposure, an i-line stepper may be used, though the present invention is not limited thereto. As such an i-line stepper, for example, a stepper FPA-3000I5+ produced by Canon Inc. may be used.

The negative photosensitive resin 308 is patterned by exposure and development to form the flow path forming member 2 having the ink ejection orifice 1. In this embodiment, the exposure is carried out at least twice, i.e., first exposure treatment and second exposure treatment. Note that, the flow path forming member is also a member which forms the ejection orifices, and thus, may also be referred to as an ejection orifice member.

Here, the first exposure treatment and the second exposure treatment are described in detail with reference to FIGS. 5A to 9C. Note that, in the following description, the second exposure treatment is first described, but any one of the first exposure treatment and the second exposure treatment may be carried out first, and the order is not specifically limited in the present invention.

Figure 5A:
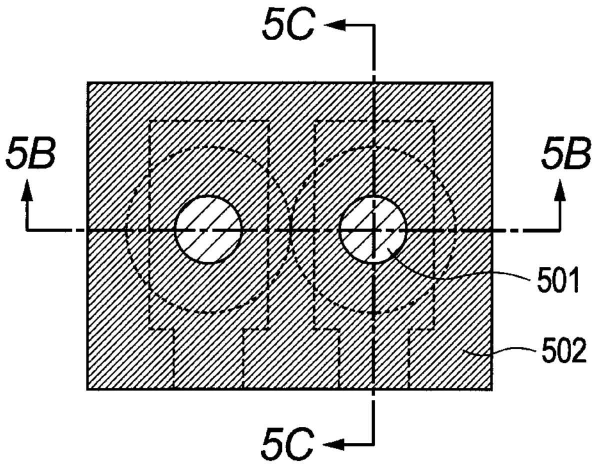
FIGS. 5A, 5B, 5C and 5D are schematic views illustrating a state after second exposure treatment is carried out.
Figure 5C:
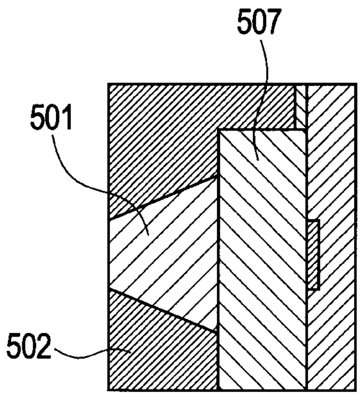
Figure 5B:
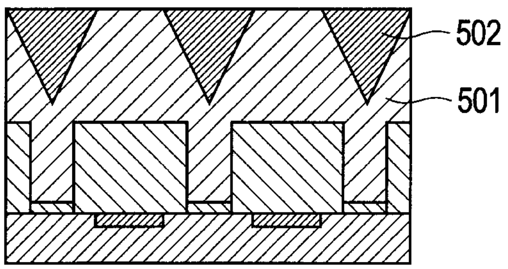
Figure 5D:
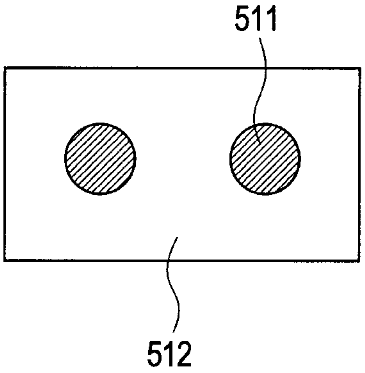

FIG. 5A is a schematic plan view for illustrating a state in the vicinity of ejection orifices after the second exposure treatment is carried out. FIG. 5B is a sectional view taken along the line 5B-5B of FIG. 5A. FIG. 5C is a sectional view taken along the line 5C-5C of FIG. 5A. FIG. 5D is a schematic view of a second mask used in the second exposure treatment. FIGS. 5A to 5C illustrate an unexposed portion 501, an exposed portion (cured portion) 502, and a flow path form material 507. Further, FIG. 5D illustrates a light impermeable portion 511 and a light permeable portion 512 of the second mask.

As described above, the second exposure treatment is of a treatment of subjecting a portion of the resin layer corresponding to other side walls than the side wall along the orthogonal direction to exposure so that the ratio d/c is larger than 1, where c is the width in the orthogonal direction of the front side opening of the ejection orifice and d is the width in the orthogonal direction of the back side opening of the ejection orifice.

The second exposure may be carried out, for example, using a stepper FPA-3000I5+ produced by Canon Inc. under the following exposure conditions: an aperture ratio (NA) of 0.45; the coherence factor (σ) of 0.5; an amount of exposure of 4,000J, and a focus offset (focus) of −50 μm. The amount of exposure is selected on the assumption that the film thickness is 30 μm.

Figure 6:
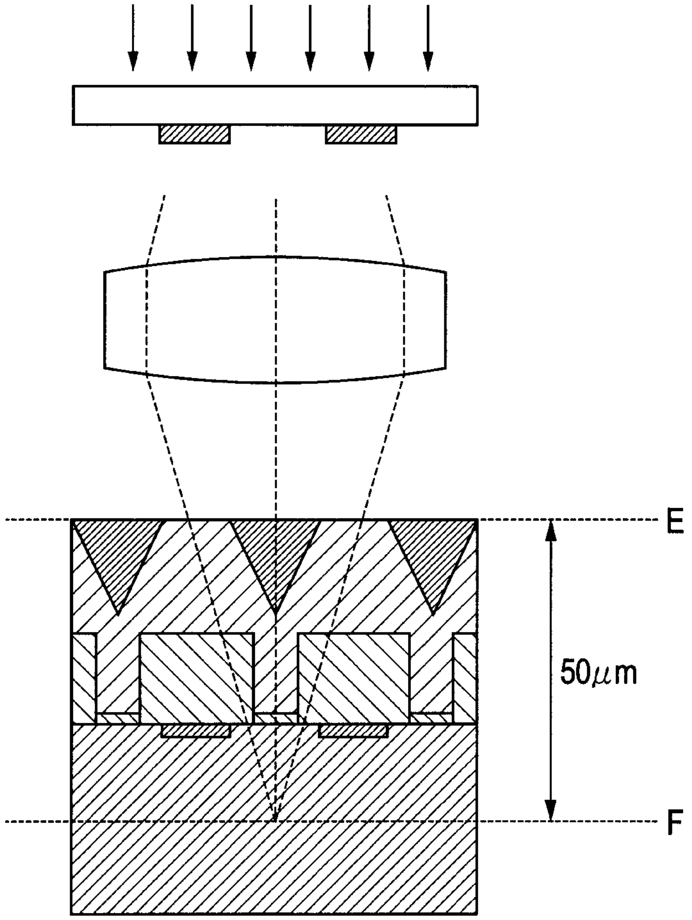
FIG. 6 is a conceptual diagram of exposure in the second exposure treatment.

FIG. 6 illustrates the concept of the above-mentioned exposure conditions in the second exposure treatment. The stepper regards an uppermost surface of an object to be subjected to exposure as a reference level, and thus, the focus position in exposure is −50 μm which is below the surface of the substrate. Note that, in FIG. 6, the dotted line E indicates the focus reference level while the dotted line F indicates the focus position.

In the exposure, by causing the depth of focus to be shallow and causing the focus offset to be large from the reference level, a tapered shape can be obtained. On the other hand, it is confirmed that, by causing the depth of focus to be deeper and causing the focus offset to be around half the thickness of the film from the reference level, a shape which is substantially straight can be obtained. Those can be realized by appropriate combinations of the photosensitive characteristics of the material and the exposure machine, and thus, in this embodiment, the selection of the shape is materialized mainly by the exposure conditions of the exposure machine and the amount of the focus offset.

When the stepper FPA−3000I5+ produced by Canon Inc. is used as the exposure machine and the thickness of the film is 30 μm, the following relationship has been confirmed. With regard to an area of an ejection orifice corresponding to a resulting diameter of 18 μm, when the film thickness is 30 μm, the shape is straight under the following exposure conditions: NA of 0.45; σ of 0.3; and the focus of −15 μm. When NA is 0.45 and σ is 0.5, if the focus is −50 μm, the tapered angle is 7 degrees. Note that, the tapered angle as used herein is, as illustrated in FIG. 1C, an angle θ formed between a virtual line drawn perpendicularly from an end of the front side opening of the ejection orifice and the wall of the ejection orifice.

Figure 7A:
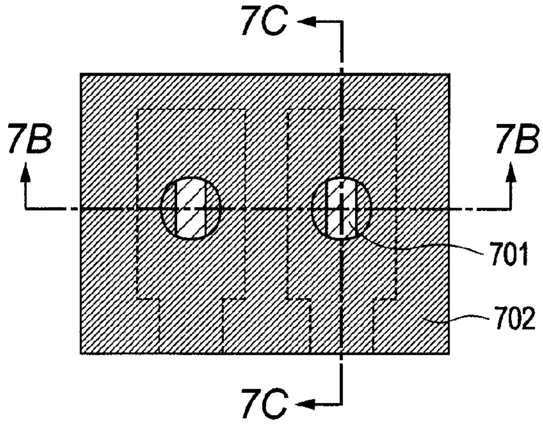
FIGS. 7A, 7B, 7C and 7D are schematic views illustrating a state in which first exposure treatment is carried out after the second exposure treatment is carried out.
Figure 7C:
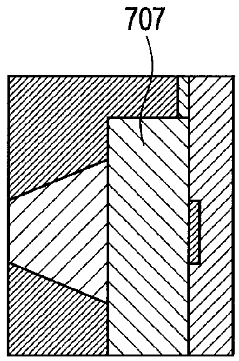
Figure 7B:
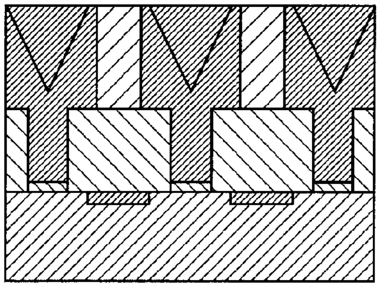
Figure 7D:
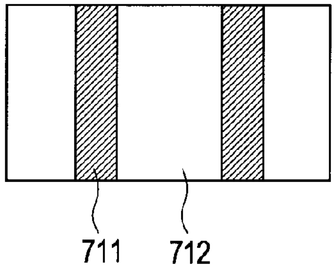

FIG. 7A is a schematic plan view for illustrating a state in the vicinity of the ejection orifices after the first exposure treatment is carried out. FIG. 7B is a sectional view taken along the line 7B-7B of FIG. 7A. FIG. 7C is a sectional view taken along the line 7C-7C of FIG. 7A. FIG. 7D is a schematic view of a first mask used in the first exposure treatment. FIGS. 7A to 7C illustrate an unexposed portion 701, an exposed portion (cured portion) 702, and a flow path form material 707. Further, FIG. 7D illustrates a light impermeable portion 711 and a light permeable portion 712 of the first mask.

It is preferred that perpendicularity be secured in the first exposure treatment. The exposure conditions of the first exposure treatment are, for example, NA of 0.45, σ of 0.30, amount of exposure of 4,000 J, and focus of −15 μm.

Figure 8:
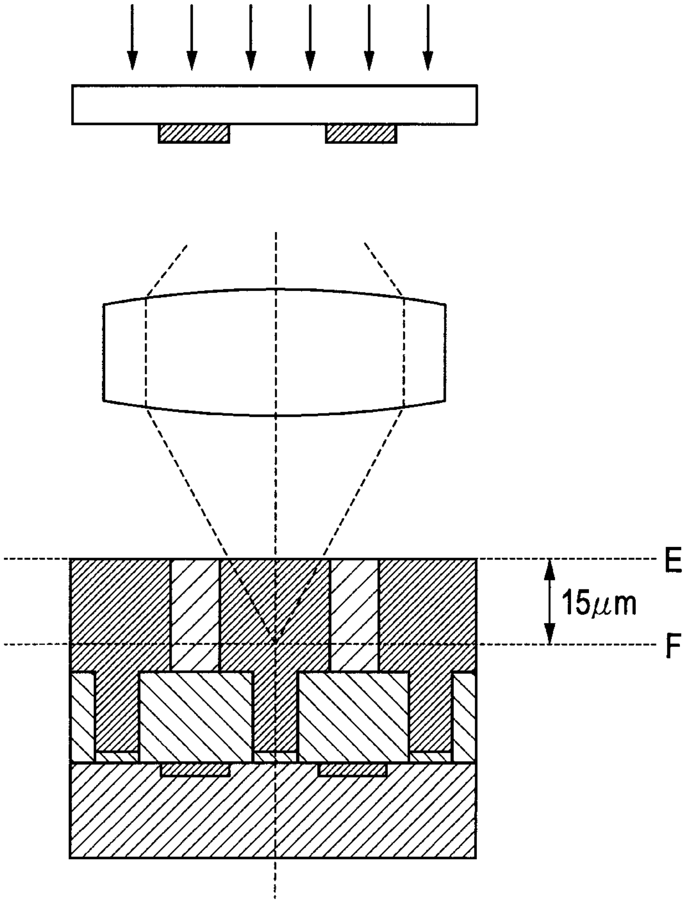
FIG. 8 is a conceptual diagram of exposure in the first exposure treatment.

FIG. 8 illustrates the concept of the above-mentioned exposure conditions in the first exposure treatment. The stepper regards an uppermost surface of an object to be subjected to exposure as a reference level, and thus, the focus position in exposure is −15 μm which is in the center of a structure.

Figure 9A:
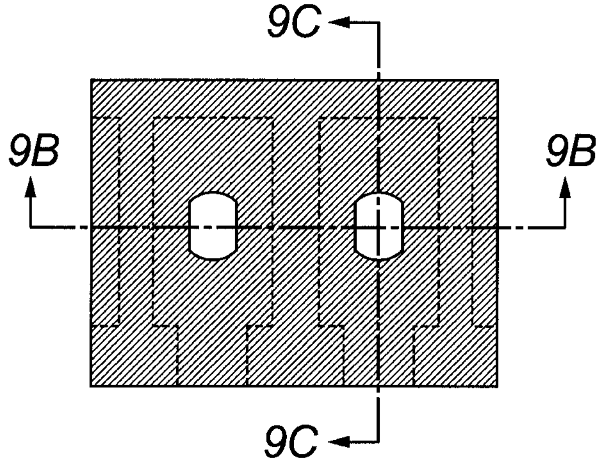
FIGS. 9A, 9B and 9C are schematic views illustrating a state after development treatment according to the first embodiment is carried out.
Figure 9C:
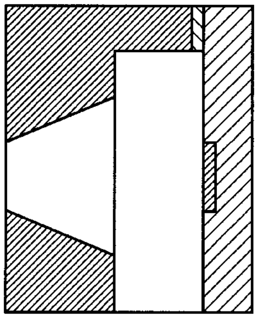
Figure 9B:
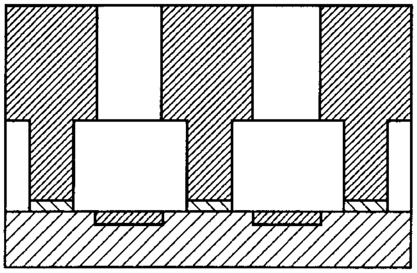

FIG. 9A is a schematic plan view illustrating the vicinity of the ejection orifices after the second exposure treatment, the first exposure treatment, and then post exposure bake (PEB) and development are completed. FIG. 9B is a sectional view taken along the line 9B-9B of FIG. 9A. FIG. 9C is a sectional view taken along the line 9C-9C of FIG. 9A.

After the first exposure treatment and the second exposure treatment, PEB and development are carried out to obtain the flow path forming member having the ejection orifice 1. Even if the order of the first exposure treatment and the second exposure treatment is changed, a problem is not caused in forming the nozzles.

Further, the masks illustrated in the figures are only exemplary and are not the only one combination for forming the shape according to the present invention. Masks of other designs may also form the shape according to the present invention.

Referring back to FIGS. 3A to 3F, the remaining manufacturing steps are next described.

Figure 3D:
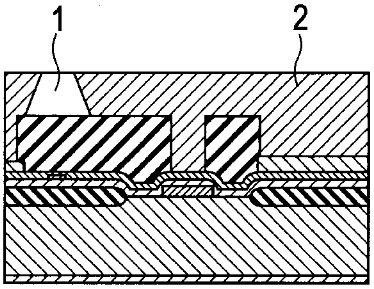

FIG. 3D is a schematic sectional view illustrating a state in which the ejection orifice 1 is formed as described above.

Figure 3E:
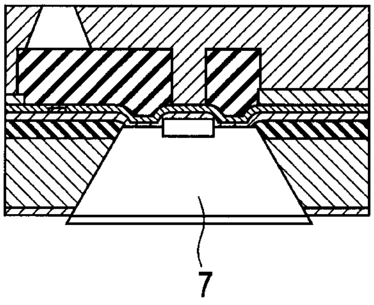

Then, as illustrated in FIG. 3E, the thermally oxidized film 301 at the back of the silicon substrate 5 is patterned to expose a silicon surface to be a starting surface of anisotropic etching. After that, silicon anisotropic etching is carried out to form an ink supply port 7. The ink supply port 7 may be formed by, for example, anisotropic etching with a strongly alkaline solution such as TMAH or KOH.

Figure 3F:
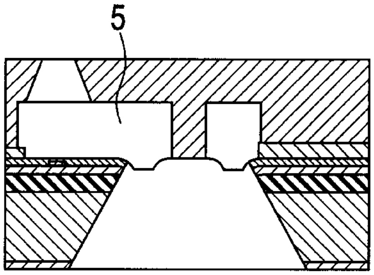

Next, as illustrated in FIG. 3F, the silicon oxide film 303 is removed by wet etching with a hydrofluoric acid liquid. After that, the silicon nitride film 304 is removed by dry etching or the like. Further, by eluting the flow path form material 307 formed of a dissolvable resin from the ink ejection orifice 1 and the ink supply port 7, the ink flow path 5 is formed. When the flow path form material 307 is removed, ultrasonic immersion may be used in combination as necessary to remove the flow path form material 307 easily.

The silicon substrate 5 having the flow path forming member formed therein by the steps described above, the flow path forming member forming a nozzle portion, is cut and separated with a dicing saw or the like to form chips. Then, after electrical joining for driving the ejection energy generating element 4 is carried out, a chip tank member for supplying ink is connected to obtain the ink jet recording head.

The above-mentioned first embodiment is described with reference to the manufacturing steps illustrated in FIGS. 3A to 3F. Note that, the present invention may be applied to other manufacturing steps. An example of other manufacturing steps is briefly described in the following with reference to FIGS. 4A to 4F.

Second Embodiment

FIGS. 4A to 4F are schematic views illustrating steps of an exemplary production process according to this embodiment. Further, FIGS. 4A to 4F are sectional views taken along the line 4A-4A of FIG. 2.

Figure 4A:
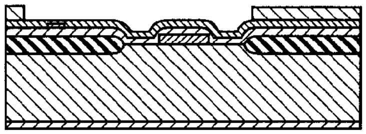
FIGS. 4A, 4B, 4C, 4D, 4E and 4F are sectional process views illustrating the production process according to the first embodiment.

FIG. 4A is similar to FIG. 3A.

Figure 4B:
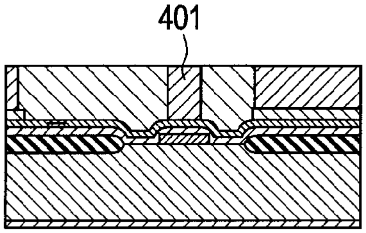

Then, as illustrated in FIG. 4B, a flow path wall 401 which is to form a side wall of the ink flow path is formed with a nozzle material by applying a photosensitive resin material and carrying out exposure, PEB, and development thereon.

Figure 4C:
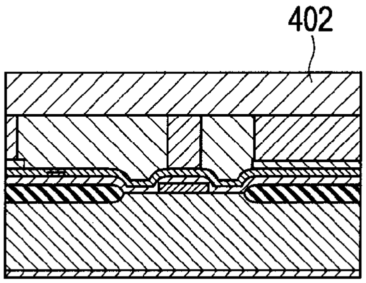

Then, as illustrated in FIG. 4C, a photosensitive dry film 402 is arranged on the flow path wall 401.

Then, the above-mentioned first exposure treatment and second exposure treatment are carried out.

Figure 4D:
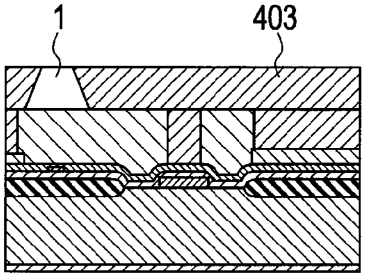

Next, as illustrated in FIG. 4D, development is carried out to form an ejection orifice member 403 having an ejection orifice 1.

Figure 4E:
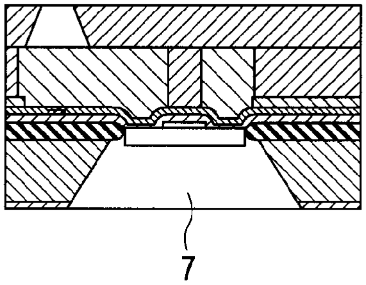
Figure 4F:
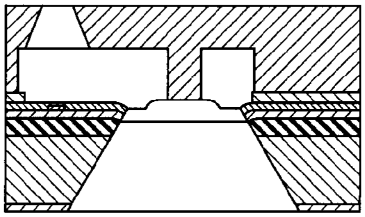

Then, as illustrated in FIG. 4E, similarly to the above-mentioned manufacturing step illustrated in FIG. 3E, an ink supply port 7 is formed. Further, as illustrated in FIG. 4F, the ink flow path is formed.

Exposure conditions according to a second embodiment of the present invention are specifically described in the following.

Figure 10A:
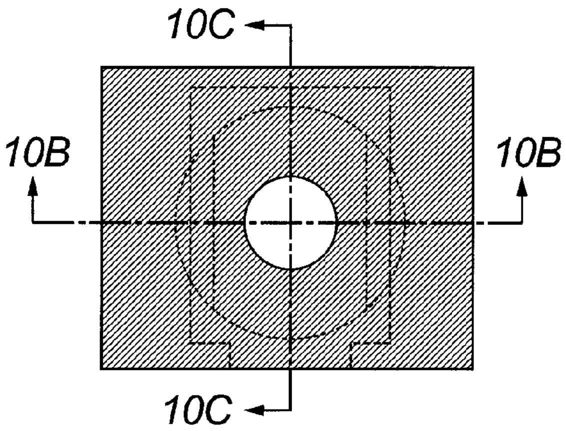
FIGS. 10A, 10B, 10C, 10D and 10E are schematic views illustrating the vicinity of an ejection orifice obtained under exposure conditions of a second embodiment of the present invention.
Figure 10C:
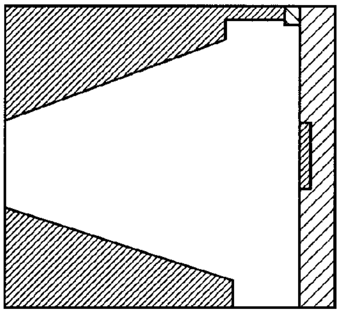
Figure 10B:
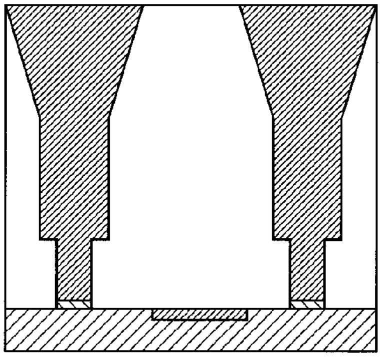
Figure 10D:
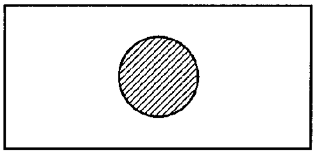
Figure 10E:
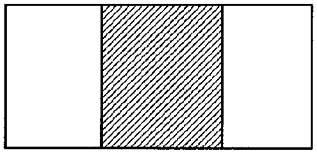

FIG. 10A is a schematic plan view illustrating the vicinity of the ejection orifices after the first exposure treatment and the second exposure treatment are carried out. FIG. 10B is a sectional view taken along the line 10B-10B of FIG. 10A. FIG. 10C is a sectional view taken along the line 10C-10C of FIG. 10A. FIGS. 10D and 10E are schematic views of masks used in exposure in this embodiment. FIG. 10D is a mask used in the second exposure treatment while FIG. 10E is a mask used in the first exposure treatment.

The exposure conditions are set on the assumption that the film thickness of a negative resin material is 80 μm. Further, in the exposure a stepper similarly to the first embodiment described above is used. The exposure conditions of the second exposure treatment are NA of 0.63, σ of 0.30, amount of exposure of 5,500 J, and focus of −75 μm. The exposure conditions of the first exposure are NA of 0.45, σ of 0.30, amount of exposure of 5,500 J, and focus of −40 μm.

When the film thickness is 80 μm, taking the film thickness into consideration, the amount of exposure is 5,000 J.

In the case of the film thickness of this embodiment, with regard to an ejection orifice diameter of 24 μm, when the exposure conditions are NA of 0.63, σ of 0.3, and focus of −75 μm, the tapered angle is 7 degrees. Further, when the exposure conditions are NA of 0.45, σ of 0.30, and focus of −40 μm, the shape is straight. The reason why the tapered angle in the first embodiment described above and the tapered angle in this embodiment are the same and still the exposure conditions are changed is that the shape of an end of an ejection orifice varies depending on the film thickness.

In any of the embodiments, compared with a case where the ejection orifices are perpendicular, improvement in the ejection characteristics is observed. According to the present invention, a liquid ejection head including an ejection orifice member that has an ejection orifice with a reduced flow resistance and that has satisfactory strength can be produced with high yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-042028, filed Feb. 28, 2011, which is hereby incorporated by reference herein in its entirety.

What is claimed is:

1. A process for producing a liquid ejection head including an ejection orifice member having a plurality of ejection orifices for ejecting liquid provided along an arrangement direction, the process comprising:

preparing a substrate provided with a resin layer which contains a photocurable resin;

carrying out a first exposure treatment and a second exposure treatment, which are each an exposure treatment of subjecting the resin layer to exposure; and forming the ejection orifices of the resin layer subjected to the first exposure treatment and the second exposure treatment, wherein an inclination angle of a side wall of the ejection orifices formed by the first exposure treatment with respect to the substrate differs from an inclination angle of a side wall of the ejection orifices formed by the second exposure treatment with respect to the substrate, wherein the ejection orifices have a side wall along a direction orthogonal to the arrangement direction, wherein the first exposure treatment is a treatment of subjecting a portion of the resin layer corresponding to the side wall along an orthogonal direction to exposure so that a ratio b/a is equal to or larger than one, where ‘a’ represents a width in the arrangement direction of a front side opening of the ejection orifices and ‘b’ represents a width in the arrangement direction of a back side opening of the ejection orifices, wherein the second exposure treatment is a treatment of subjecting a portion of the resin layer corresponding to side walls other than the side wall along the orthogonal direction to exposure so that a ratio d/c is larger than one, where ‘c’ represents a width in the orthogonal direction of the front side opening of the ejection orifices and d represents a width in the orthogonal direction of the back side opening of the ejection orifices, and wherein the ratio d/c is larger than the ratio b/a.

2. A process for producing a liquid ejection head according to claim 1, wherein a shape in cross section of the ejection orifices taken along a surface perpendicular to the arrangement direction is of a tapered shape.

3. A process for producing a liquid ejection head according to claim 1, wherein a shape in cross section of the ejection orifices taken along a surface perpendicular to the orthogonal direction is a tapered shape or a quadrangular shape.

4. A process for producing a liquid ejection head according to claim 1, wherein:

the width a and the width b are a width of an upper side and a width of a lower side, respectively, of a shape in cross section of the ejection orifices taken along a surface which is perpendicular to the arrangement direction and which passes through a center of the ejection orifices; and the width c and the width d are a width of an upper side and a width of a lower side, respectively, of a shape in cross section of the ejection orifices taken along a surface which is perpendicular to the orthogonal direction and which passes through the center of the ejection orifices.

* * * * *